US012805330B2

(12) United States Patent
Chiu et al.

(10) Patent No.: US 12,805,330 B2
(45) Date of Patent: Nov. 17, 2026

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Ko-Wei Chang, Taichung (TW); Chia-Yang Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 732 days.

(21) Appl. No.: 18/298,819

(22) Filed: Apr. 11, 2023

(65) Prior Publication Data

US 2024/0170415 A1 May 23, 2024

(30) Foreign Application Priority Data

Nov. 22, 2022 (TW) ................................. 111144619

(51) Int. Cl.

| | |
|---|---|
| ***H01L 23/552*** | (2006.01) |
| ***H10W 42/20*** | (2026.01) |
| ***H10W 74/01*** | (2026.01) |
| ***H10W 90/00*** | (2026.01) |

(52) U.S. Cl.

CPC ........... *H10W 42/20* (2026.01); *H10W 74/01* (2026.01); *H10W 90/00* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 9,613,857 | B2 * | 4/2017 | Chen | H10W 20/056 |
| 10,553,542 | B2 * | 2/2020 | Shin | H10W 42/20 |
| 11,948,891 | B2 * | 4/2024 | Park | H10W 70/09 |
| 2018/0068983 | A1 * | 3/2018 | Chang | H10W 42/20 |

* cited by examiner

*Primary Examiner* — Long Pham

(74) *Attorney, Agent, or Firm* — Studebaker Brackett PLLC

(57) ABSTRACT

An electronic package and a method thereof are provided, in which an electronic component, conductive structures and conductive components are disposed on one side of a carrier and electrically connected to the carrier. The electronic component, the conductive structures and the conductive components are encapsulated by an encapsulation layer. A shielding layer is formed on the encapsulation layer to cover the electronic component, where the shielding layer is electrically connected to the conductive structures and free from being electrically connected to the conductive components. A shielding structure is formed to cover the other side of the carrier.

20 Claims, 7 Drawing Sheets

ELECTRONIC PACKAGE AND MANUFACTURING METHOD THEREOF

BACKGROUND

1. Technical Field

The present disclosure relates to a semiconductor package, and more particularly, to an electronic package with shielding function and manufacturing method thereof.

2. Description of Related Art

In recent years, with vigorous development of portable electronic products, developments of various related products are also towards the trend of high density, high performance, light, thin, short and small, and each aspect of package on package (PoP) is therefore rolled out to meet the requirements of light, thin, short, small and high density.

FIG. 1 is a schematic cross-sectional view of a conventional semiconductor package 1. As shown in FIG. 1, in the manufacturing method of the semiconductor package 1, semiconductor components 11, 12 are disposed on upper and lower sides of a substrate 10, respectively. Then, the semiconductor components 11, 12 are encapsulated by a molding compound 14, and contacts (I/O) 100 of the substrate 10 are exposed from openings 140 of the molding compound 14. Afterwards, a plurality of solder balls 13 are formed on the contacts 100, and finally a shielding layer 18 is formed on the six surfaces of an overall structure. In the subsequent manufacturing process, the semiconductor package 1 is connected to an electronic device (not shown) such as a circuit board or a further wire board via the solder balls 13, and the shielding layer 18 can provide the function of shielding electromagnetic interference to the semiconductor components 11, 12.

However, in the conventional semiconductor package 1, the shielding layer 18 on a ball-placement side (i.e., the side with the solder balls 13) is formed as a relatively incomplete structure in order to get around the solder balls 13, resulting in the increase of the impedance of the shielding layer 18, thereby significantly reducing the shielding effect.

Therefore, how to overcome the aforementioned drawbacks of the prior art has become an urgent issue to be addressed at present.

SUMMARY

In view of the various shortcomings of the prior art, the present disclosure provides an electronic package, which comprises: an electronic module including a carrier, an electronic component, a plurality of conductive structures and a plurality of conductive components disposed on the carrier, wherein the electronic component, the plurality of conductive structures and the plurality of conductive components are electrically connected to the carrier; an encapsulation layer formed on the carrier and encapsulating the electronic component, the plurality of conductive structures and the plurality of conductive components; a shielding layer formed on the encapsulation layer and covering the electronic component, wherein the shielding layer is electrically connected to the plurality of conductive structures and free from being electrically connected to the plurality of conductive components; and a shielding structure covering the electronic module.

The present disclosure also provides a method of manufacturing an electronic package, the method comprises: providing an electronic module including a carrier, an electronic component, a plurality of conductive structures and a plurality of conductive components disposed on the carrier, wherein the electronic component, the plurality of conductive structures and the plurality of conductive components are electrically connected to the carrier; forming an encapsulation layer on the carrier, wherein the electronic component, the plurality of conductive structures and the plurality of conductive components are encapsulated by the encapsulation layer; forming a shielding layer on the encapsulation layer, wherein the electronic component is covered by the shielding layer, wherein the shielding layer is electrically connected to the plurality of conductive structures and free from being electrically connected to the plurality of conductive components; and forming a shielding structure on the electronic module, wherein the electronic module is covered by the shielding structure.

In the aforementioned electronic package and method, end surfaces of the plurality of conductive structures are flush with a surface of the encapsulation layer and in contact with the shielding layer.

In the aforementioned electronic package and method, the plurality of conductive structures are embedded in the encapsulation layer, wherein the shielding layer extends into the encapsulation layer and is in contact with the plurality of conductive structures.

In the aforementioned electronic package and method, the shielding structure extends on the encapsulation layer and is in contact with the shielding layer.

In the aforementioned electronic package and method, each of the plurality of conductive structures is in a form of a metal pillar, a wire, or a combination of bumps.

In the aforementioned electronic package and method, each of the plurality of conductive components is in a form of a solder ball or a combination of bumps.

In the aforementioned electronic package and method, the carrier has a first side and a second side opposing the first side, wherein the encapsulation layer, the electronic component, the plurality of conductive structures and the plurality of conductive components are formed on the second side of the carrier. For instance, the present disclosure further comprises disposing another electronic component on the first side of the carrier, and the electronic module further comprises a packaging layer encapsulating the another electronic component. Further, the packaging layer of the electronic module, side surfaces of the carrier and the another electronic component are covered by the shielding structure.

As can be understood from the above, in the electronic package of the present disclosure and the manufacturing method thereof, the design of the conductive structures grounding the shielding layer and the carrier allows the charges of the carrier to be quickly conducted, thereby providing electromagnetic interference (EMI) shielding effect to the electronic component. Therefore, compared with the prior art, the grounding function of the electronic package of the present disclosure can reduce the grounding path since the conductive structures are adjacent to the electronic component, thereby enhancing the shielding performance.

BRIEF DESCRIPTION OF THE DRAWINGS

FIG. 2A, FIG. 2B, FIG. 2C-1 and FIG. 2D are schematic cross-sectional views illustrating a method of manufacturing an electronic package according to the present disclosure.

FIG. 2C-2 is a schematic bottom view of FIG. 2C-1.

FIG. 3-1 is a schematic cross-sectional view showing another embodiment of FIG. 2D.

FIG. 3-2 is a schematic bottom view of FIG. 3-1.

DETAILED DESCRIPTIONS

Figure 1:
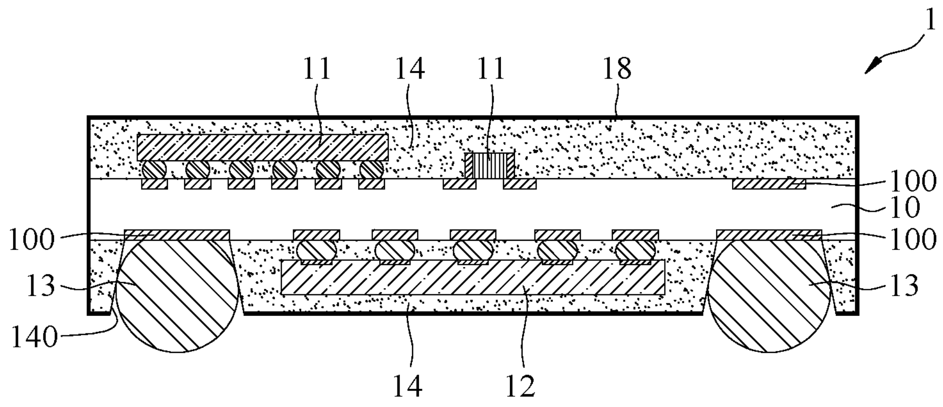
FIG. 1 (PRIOR ART)
FIG. 1 is a schematic cross-sectional view of a conventional semiconductor package.

Implementations of the present disclosure are illustrated using the following embodiments. One of ordinary skill in the art can readily appreciate other advantages and technical effects of the present disclosure upon reading the content of this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "first," "second," "a," "one," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIG. 2A, FIG. 2B, FIG. 2C-1 and FIG. 2D are schematic cross-sectional views illustrating a method of manufacturing an electronic package 2 according to the present disclosure.

Figure 2A:
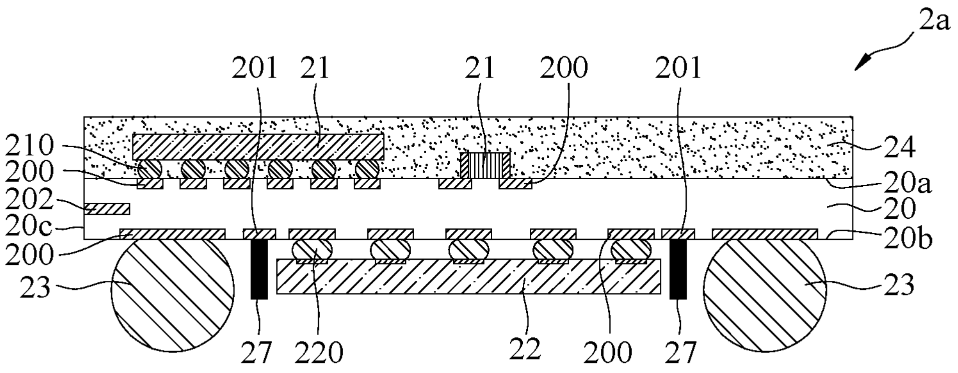

As shown in FIG. 2A, an electronic module 2*a* is provided and comprises a carrier 20, and first electronic components 21, a second electronic component 22, conductive components 23 and conductive structures 27 disposed on the carrier 20.

The carrier 20 has a first side 20*a* and a second side 20*b* opposing the first side 20*a*. In an embodiment, the carrier 20 is a package substrate with a core layer and a circuit structure or a coreless circuit structure, and the carrier 20 has a plurality of circuit layers 200 such as fan-out redistribution layers (RDLs), wherein the circuit layer 200 has at least one first grounding wire 201 located at the second side 20*b*, and the circuit layer 200 at a side surface 20*c* of the carrier 20 has a second grounding wire 202 exposed from the side surface 20*c*. It should be understood that the carrier 20 can also be other carrier units for carrying electronic components such as chips (for example, the carrier 20 can be a lead frame), but the present disclosure is not limited to as such.

The first electronic components 21 are disposed on the first side 20*a* of the carrier 20. In an embodiment, the first electronic component 21 is an active component, a passive component, or a combination of the active component and the passive component, etc., wherein the active component is for example a semiconductor chip, and the passive component is for example a resistor, a capacitor, or an inductor. For instance, the first electronic component 21 is disposed on the circuit layer 200 in a flip-chip manner by a plurality of conductive bumps 210 such as solder material and is electrically connected to the circuit layer 200; alternatively, the first electronic component 21 can be electrically connected to the circuit layer 200 in a wire-bonding manner via a plurality of bonding wires (not shown); or, the first electronic component 21 can be in direct contact with the circuit layer 200. However, the manner in which the first electronic components 21 can be electrically connected to the carrier 20 is not limited to the above.

Moreover, a packaging layer 24 can be formed on the carrier 20 to encapsulate the first electronic components 21. For instance, the packaging layer 24 is made of an insulating material such as polyimide (PI), dry film, encapsulant such as epoxy resin, or molding compound. Therefore, the packaging layer 24 can be formed on the carrier 20 by liquid compound, injection, lamination, or compression molding.

In addition, after forming the packaging layer 24, the second electronic component 22, the conductive components 23 and the conductive structures 27 can be disposed on the carrier 20.

The second electronic component 22 is disposed on the second side 20*b* of the carrier 20. In an embodiment, the second electronic component 22 is an active component, a passive component, or a combination of the active component and the passive component, etc., wherein the active component is for example a semiconductor chip, and the passive component is for example a resistor, a capacitor, or an inductor. For instance, the second electronic component 22 is disposed on the circuit layer 200 in a flip-chip manner by a plurality of conductive bumps 220 such as solder material; alternatively, the second electronic component 22 can be electrically connected to the circuit layer 200 in a wire-bonding manner by a plurality of bonding wires (not shown). However, the manner in which the second electronic component 22 can be electrically connected to the carrier 20 is not limited to the above.

The conductive components 23 are disposed on the circuit layer 200 of the second side 20*b* of the carrier 20. In an embodiment, the conductive components 23 are solder balls, but the present disclosure is not limited to as such.

The conductive structures 27 are disposed on the second side 20*b* of the carrier 20, and are disposed around the second electronic component 22. In an embodiment, the conductive structure 27 is a metal pillar formed by electroplating copper and is electrically connected to (e.g., is grounded to) the first grounding wire 201 of the carrier 20, and the conductive component 23 is located outside the conductive structure 27.

Figure 2B:
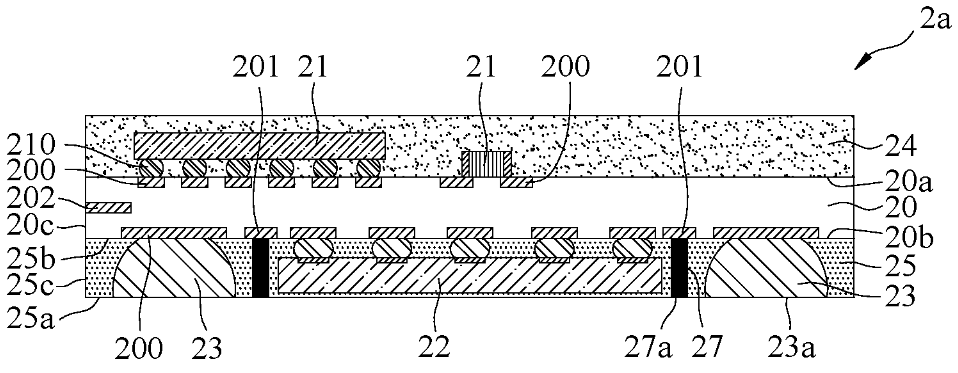

As shown in FIG. 2B, an encapsulation layer 25 is formed on the second side 20*b* of the carrier 20, wherein the second electronic component 22, the conductive structures 27 and the conductive components 23 are encapsulated by the encapsulation layer 25, and the conductive structures 27 and the conductive components 23 are exposed from the encapsulation layer 25.

In an embodiment, the encapsulation layer 25 is defined to have a first surface 25*a* and a second surface 25*b* opposing the first surface 25*a*, and side surfaces 25*c* adjacently connected to the first surface 25*a* and the second surface 25*b*, wherein the encapsulation layer 25 is bonded to the second side 20*b* of the carrier 20 with the second surface 25*b*. Furthermore, by means of a leveling process, the first surface 25*a* of the encapsulation layer 25 is flush with end surfaces 27*a* of the conductive structures 27 and surfaces 23*a* of the conductive components 23, such that the conductive structures 27 and the conductive components 23 are exposed from the encapsulation layer 25. For instance, through a leveling process such as grinding, a portion of the material of the encapsulation layer 25 and a portion of the material of the conductive components 23 can be removed, even a portion of the material of the conductive structures 27 can be removed. It should be understood that the surface of the second electronic component 22 can also be flush with the first surface 25*a* of the encapsulation layer 25 so as to be exposed from the encapsulation layer 25 according to requirements.

Figures 1, 2C:
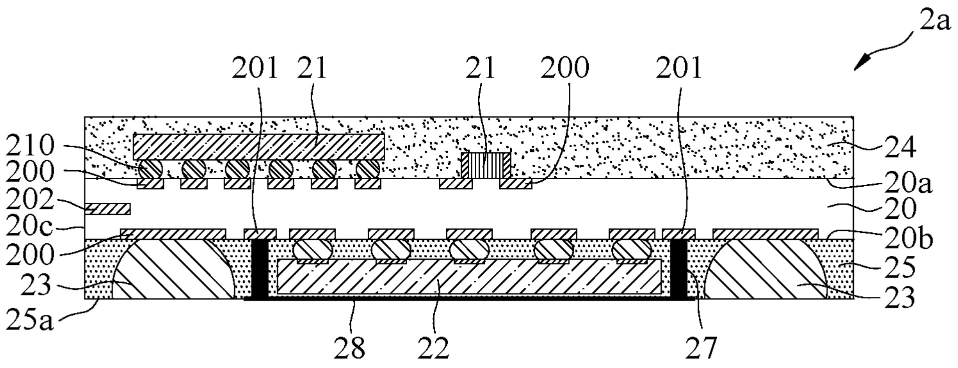
Figures 2, 2C:
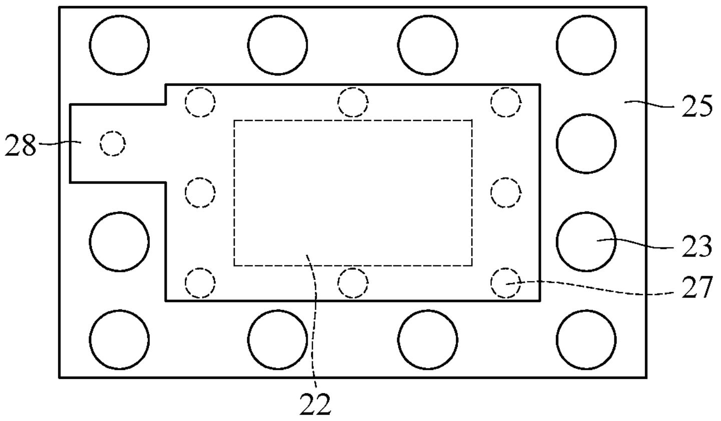
Figure 2D:
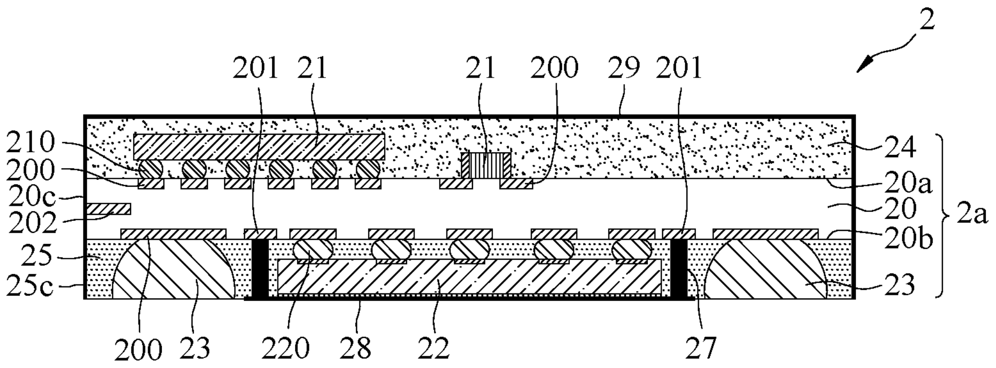
Figure 2E:
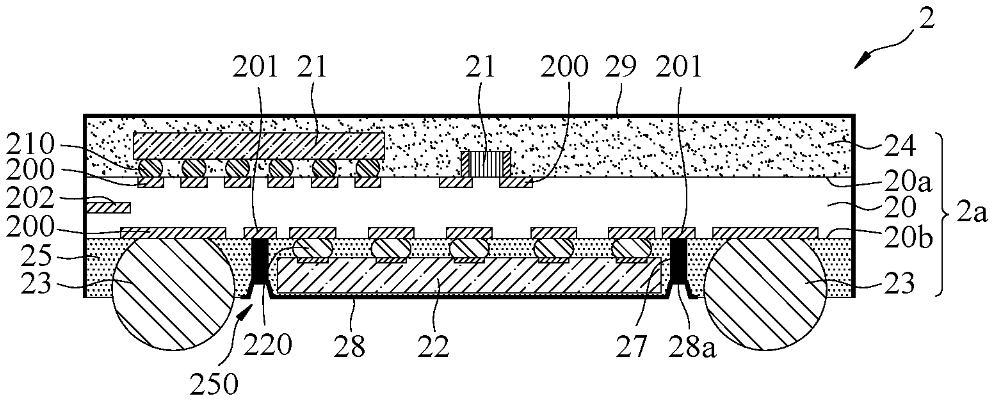
FIG. 2E is a schematic cross-sectional view showing another aspect of FIG. 2D.

Moreover, the conductive structures 27 can also be embedded in the first surface 25*a* of the encapsulation layer 25, such that the conductive structures 27 are exposed from the encapsulation layer 25 by openings, as shown in FIG. 2E. For instance, an opening 250 corresponding to the conductive structure 27 for exposing the conductive structure 27 is formed on the first surface 25*a* of the encapsulation layer 25. It should be understood that the conductive components 23 and/or the second electronic component 22 can also be exposed from the encapsulation layer 25 by openings.

Additionally, the encapsulation layer 25 is made of an insulating material such as polyimide (PI), dry film, encapsulant such as epoxy resin, or molding compound, and the encapsulation layer 25 can be formed on the carrier 20 by lamination or molding. It should be understood that the material for forming the encapsulation layer 25 and the material for forming the packaging layer 24 can be the same or different.

Besides, the encapsulation layer 25 and the packaging layer 24 can be manufactured in the same manufacturing process to form a single package.

As shown in FIG. 2C-1, a shielding layer 28 is formed on the first surface 25*a* of the encapsulation layer 25, so that the second electronic component 22 is covered by the shielding layer 28, and the shielding layer 28 is electrically connected to (is grounded to) the conductive structures 27 and free from being electrically connected to the conductive components 23.

In an embodiment, the shielding layer 28 is a metal layer and is formed on the first surface 25*a* of the encapsulation layer 25 by electroplating, chemical plating, or other coating methods. For instance, the shielding layer 28 is merely in contact with the conductive structures 27 and free from being in contact with the conductive components 23. It should be understood that there are many types of the shielding layer 28, such as in a form of thin film, and the present disclosure is not limited to the above.

Figures 1, 3:
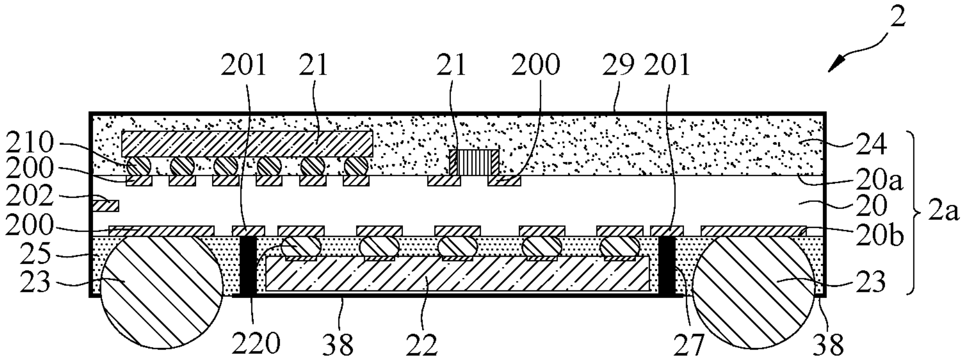
Figures 2, 3:
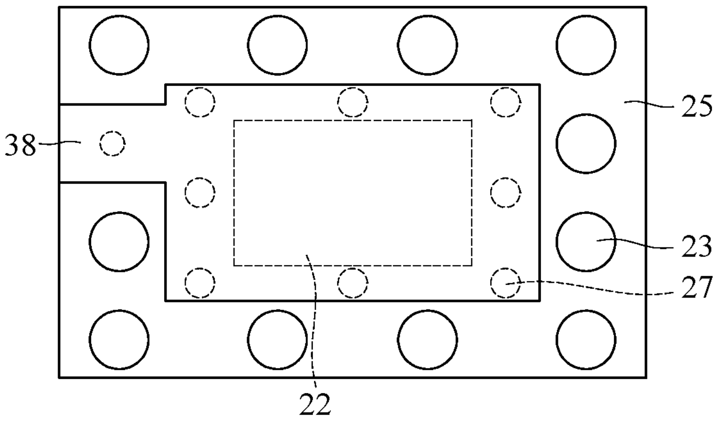

In addition, the shielding layer 28 is free from being connected to the edge of the first surface 25*a* of the encapsulation layer 25, as shown in FIG. 2C-2; alternatively, a shielding layer 38 can be connected to the edge of the first surface 25*a* of the encapsulation layer 25, as shown in FIG. 3-2.

Furthermore, in other embodiments, a shielding layer 28*a* can also extend into the openings 250 to be in contact with the conductive structures 27, as shown in FIG. 2E.

As shown in FIG. 2D, a shielding structure 29 is formed on the electronic module 2*a* (the side surfaces 20*c* of the carrier 20 and the packaging layer 24), so that the shielding structure 29 encapsulates the electronic module 2*a* and covers the first electronic components 21, so as to obtain the electronic package 2. In the subsequent manufacturing process, the electronic package 2 is externally connected to an electronic device (not shown) such as a circuit board, a circuit structure, a packaging structure, or others via the conductive components 23.

In an embodiment, the shielding structure 29 is a metal layer and is formed by electroplating, chemical plating, or other coating methods. For instance, the shielding structure 29 covers the first electronic components 21. It should be understood that there are many kinds of the shielding structure 29, such as in a form of frame, cover, etc., and the present disclosure is not limited to the above.

Additionally, the shielding structure 29 can extend on the side surfaces 25*c* of the encapsulation layer 25 to be in contact with the second grounding wire 202, and the shielding structure 29 is free from being connected to the shielding layer 28; alternatively, the shielding structure 29 extends on the side surfaces 25*c* of the encapsulation layer 25, and the shielding structure 29 is connected to the shielding layer 38, as shown in FIG. 3-1. Therefore, by means of the arrangement of the first grounding wire 201 and the second grounding wire 202, the grounding method with respect to the shielding structure 29 and the shielding layer 28, 38 can be adjusted according to requirements.

Figure 4A:
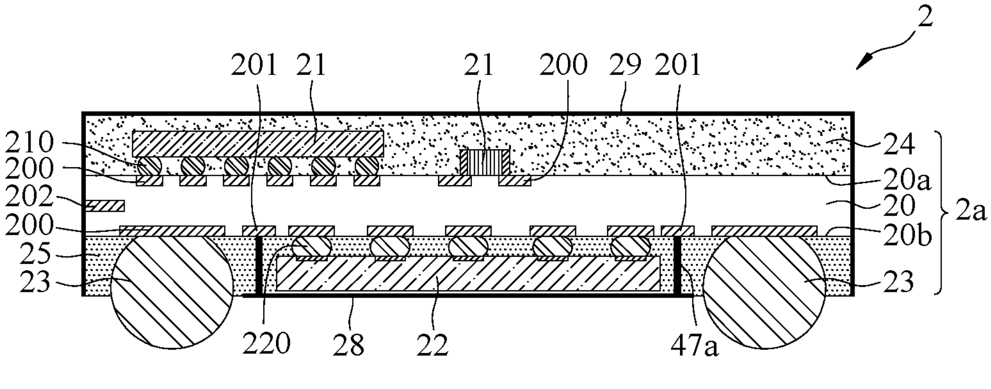
FIG. 4A and FIG. 4B are schematic cross-sectional views showing other embodiments of conductive structures of FIG. 2D.
Figure 4B:
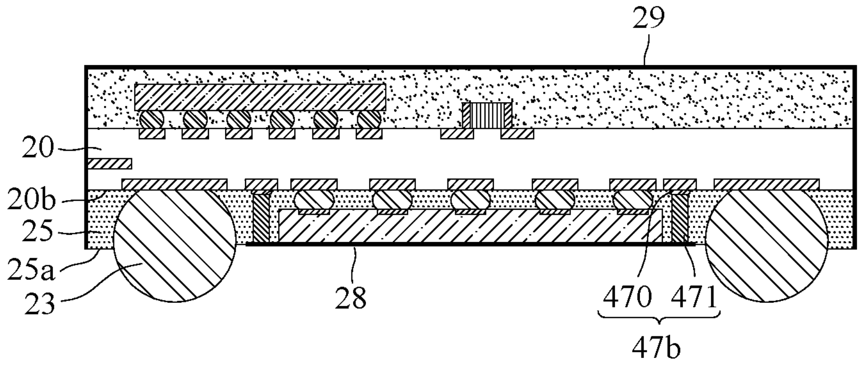

Moreover, the conductive structures 27 are used for grounding and connecting the carrier 20 and the shielding layer 28, and there are many types of the conductive structures 27 (e.g., the types of the conductive structures 27 include wire, combination of bumps, etc.). For instance, each of conductive structures 47*a* shown in FIG. 4A is a wire (bonding wire formed by wire bonding); alternatively, each of conductive structures 47*b* shown in FIG. 4B includes a solder material 470 and a pin 471 of a metal frame, wherein the pin 471 of the metal frame is bonded onto the second side 20*b* of the carrier 20 via the solder material 470, and the pin 471 is exposed from the first surface 25*a* of the encapsulation layer 25 via the leveling process.

Figure 5A:
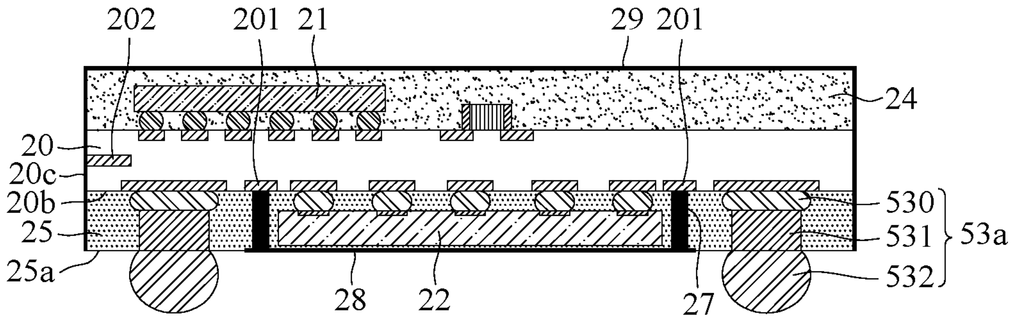
FIG. 5A and FIG. 5B are schematic cross-sectional views showing other embodiments of conductive components of FIG. 2D.
Figure 5B:
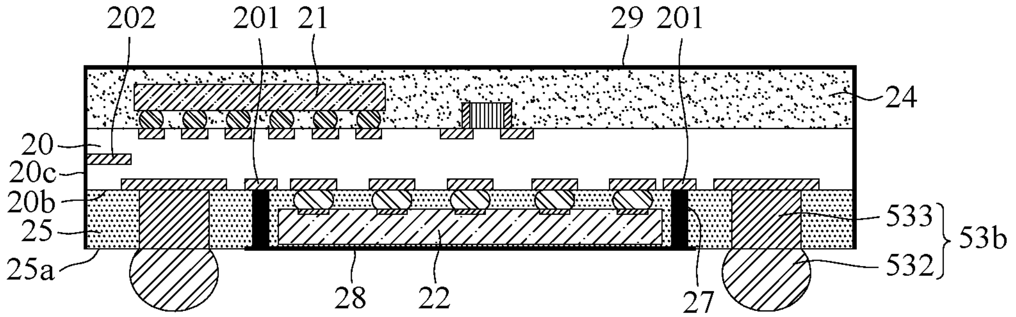

In addition, the conductive components 23 are used for externally connecting to other electronic devices, and there are also many types of the conductive components 23 (e.g., the types of the conductive components 23 include combination of bumps, etc.). For instance, each of conductive components 53*a* shown in FIG. 5A includes a solder material 530, a pin 531 of a metal frame and a solder bump 532, wherein the pin 531 of the metal frame is bonded onto the second side 20*b* of the carrier 20 via the solder material 530, and the pin 531 is exposed from the first surface 25*a* of the encapsulation layer 25 via the leveling process so as to bond the solder bump 532 on the pin 531. It should be understood that each of conductive components 53*b* shown in FIG. 5B includes the solder bump 532 and a metal bump 533, wherein the metal bump 533 is formed by electroplating copper, and the metal bump 533 is exposed from the first surface 25*a* of the encapsulation layer 25 via the leveling process so as to bond the solder bump 532 on the metal bump 533.

Therefore, in the manufacturing method of the electronic package 2 of the present disclosure, the design of the conductive structures 27, 47*a*, 47*b* grounding the shielding layers 28, 28*a*, 38 and the carrier 20 allows the charges of the carrier 20 to be quickly conducted, thereby providing electromagnetic interference (EMI) shielding effect to the second electronic component 22.

Further, even if the shielding layers 28, 28*a*, 38 on a ball-placement side (such as the second side 20*b* of the carrier 20) are formed as relatively incomplete structures in order to get around the conductive components 23, 53*a*, 53*b* (e.g., the non-rectangular structure as shown in FIG. 2C-2 or FIG. 3-2), the design of the conductive structures 27, 47*a*, 47*b* can avoid the problem of affecting the shielding effect due to the impedance increase caused by the shielding layers 28, 28*a*, 38 of the incomplete structures. Hence, compared with the prior art, the grounding function of the ball-placement side of the electronic package 2 of the present disclosure can reduce the grounding path since the conductive structures 27, 47*a*, 47*b* are adjacent to the second electronic component 22, thereby enhancing the shielding performance.

The present disclosure also provides an electronic package 2, which comprises: an electronic module 2*a*, an encapsulation layer 25, at least one shielding layer 28, 28*a*, 38, and a shielding structure 29.

The electronic module 2*a* comprises a carrier 20, at least one second electronic component 22, a plurality of conductive structures 27, 47*a*, 47*b* and a plurality of conductive components 23, 53*a*, 53*b* disposed on the carrier 20, wherein the second electronic component 22, the conductive structures 27, 47*a*, 47*b* and the conductive components 23, 53*a*, 53*b* are electrically connected to the carrier 20.

The encapsulation layer 25 is formed on the carrier 20 to encapsulate the second electronic component 22, the conductive structures 27, 47*a*, 47*b* and the conductive components 23, 53*a*, 53*b*.

The shielding layers 28, 28*a*, 38 are formed on the encapsulation layer 25 to cover the second electronic component 22, and the shielding layers 28, 28*a*, 38 are electrically connected to the conductive structures 27, 47*a*, 47*b* and free from being electrically connected to the conductive components 23, 53*a*, 53*b*.

The shielding structure 29 encapsulates the electronic module 2*a*.

In an embodiment, end surfaces 27*a* of the conductive structures 27 are flush with the first surface 25*a* of the encapsulation layer 25 and in contact with the shielding layer 28, 38.

In an embodiment, the conductive structures 27 are embedded in the encapsulation layer 25, wherein the shielding layer 28*a* extends into the encapsulation layer 25 and is in contact with the conductive structures 27.

In an embodiment, the shielding structure 29 extends on side surfaces 25*c* of the encapsulation layer 25 and is in contact with the shielding layer 38.

In an embodiment, the conductive structures 27, 47*a*, 47*b* are in forms of metal pillars, wires, or combinations of bumps.

In an embodiment, the conductive components 23, 53*a*, 53*b* are in forms of solder balls or combinations of bumps.

In an embodiment, the carrier 20 has a first side 20*a* and a second side 20*b* opposing the first side 20*a*, wherein the encapsulation layer 25, the second electronic component 22, the conductive structures 27, 47*a*, 47*b* and the conductive components 23, 53*a*, 53*b* are formed on the second side 20*b* of the carrier 20. For instance, at least one first electronic component 21 is disposed on the first side 20*a* of the carrier 20, and the electronic module 2*a* further comprises a packaging layer 24 encapsulating the first electronic component 21. Further, the shielding structure 29 encapsulates the packaging layer 24 of the electronic module 2*a* and the side surfaces 20*c* of the carrier 20 to cover the first electronic component 21.

To sum up, in the electronic package of the present disclosure and the manufacturing method thereof, the design of the conductive structures grounding the shielding layer and the carrier allows the charges of the carrier to be quickly conducted, thereby providing electromagnetic interference (EMI) shielding effect to the second electronic component. Therefore, the grounding function of the electronic package of the present disclosure can reduce the grounding path since the conductive structures are adjacent to the second electronic component, thereby enhancing the shielding performance.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. An electronic package, comprising:

an electronic module including a carrier, an electronic component, a plurality of conductive structures and a plurality of conductive components disposed on the carrier, wherein the electronic component, the plurality of conductive structures and the plurality of conductive components are electrically connected to the carrier;

an encapsulation layer formed on the carrier and encapsulating the electronic component, the plurality of conductive structures and the plurality of conductive components;

a shielding layer formed on the encapsulation layer and covering the electronic component, wherein the shielding layer is electrically connected to the plurality of conductive structures and free from being electrically connected to the plurality of conductive components; and a shielding structure covering the electronic module.

2. The electronic package of claim 1, wherein end surfaces of the plurality of conductive structures are flush with a surface of the encapsulation layer and in contact with the shielding layer.

3. The electronic package of claim 1, wherein the plurality of conductive structures are embedded in the encapsulation layer, wherein the shielding layer extends into the encapsulation layer and is in contact with the plurality of conductive structures.

4. The electronic package of claim 1, wherein the shielding structure extends on the encapsulation layer and is in contact with the shielding layer.

5. The electronic package of claim 1, wherein each of the plurality of conductive structures is in a form of a metal pillar, a wire, or a combination of bumps.

6. The electronic package of claim 1, wherein each of the plurality of conductive components is in a form of a solder ball or a combination of bumps.

7. The electronic package of claim 1, wherein the carrier has a first side and a second side opposing the first side, wherein the encapsulation layer, the electronic component, the plurality of conductive structures and the plurality of conductive components are formed on the second side of the carrier.

8. The electronic package of claim 7, further comprising another electronic component disposed on the first side of the carrier.

9. The electronic package of claim 8, wherein the electronic module further comprises a packaging layer encapsulating the another electronic component.

10. The electronic package of claim 9, wherein the packaging layer of the electronic module, side surfaces of the carrier and the another electronic component are covered by the shielding structure.

11. A method of manufacturing an electronic package, comprising:

providing an electronic module including a carrier, an electronic component, a plurality of conductive structures and a plurality of conductive components disposed on the carrier, wherein the electronic component, the plurality of conductive structures and the plurality of conductive components are electrically connected to the carrier;

forming an encapsulation layer on the carrier, wherein the electronic component, the plurality of conductive structures and the plurality of conductive components are encapsulated by the encapsulation layer;

forming a shielding layer on the encapsulation layer, wherein the electronic component is covered by the shielding layer, wherein the shielding layer is electrically connected to the plurality of conductive structures and free from being electrically connected to the plurality of conductive components; and forming a shielding structure on the electronic module, wherein the electronic module is covered by the shielding structure.

12. The method of claim 11, wherein end surfaces of the plurality of conductive structures are flush with a surface of the encapsulation layer and in contact with the shielding layer.

13. The method of claim 11, wherein the plurality of conductive structures are embedded in the encapsulation layer, wherein the shielding layer extends into the encapsulation layer and is in contact with the plurality of conductive structures.

14. The method of claim 11, wherein the shielding structure extends on the encapsulation layer and is in contact with the shielding layer.

15. The method of claim 11, wherein each of the plurality of conductive structures is in a form of a metal pillar, a wire, or a combination of bumps.

16. The method of claim 11, wherein each of the plurality of conductive components is in a form of a solder ball or a combination of bumps.

17. The method of claim 11, wherein the carrier has a first side and a second side opposing the first side, wherein the encapsulation layer, the electronic component, the plurality of conductive structures and the plurality of conductive components are formed on the second side of the carrier.

18. The method of claim 17, further comprising disposing another electronic component on the first side of the carrier.

19. The method of claim 18, wherein the electronic module further comprises a packaging layer encapsulating the another electronic component.

20. The method of claim 19, wherein the packaging layer of the electronic module, side surfaces of the carrier and the another electronic component are covered by the shielding structure.

* * * * *